(12) United States Patent
Mishra et al.

(10) Patent No.: US 11,038,544 B2
(45) Date of Patent: Jun. 15, 2021

(54) METHOD AND APPARATUS FOR IIP2 CALIBRATION

(71) Applicant: Apple Inc., Cupertino, CA (US)

(72) Inventors: Yatish Mishra, Tempe, AZ (US); Jorge Ivonnet, Chandler, AZ (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/641,571

(22) PCT Filed: Aug. 31, 2017

(86) PCT No.: PCT/US2017/049614
§ 371 (c)(1),
(2) Date: Feb. 24, 2020

(87) PCT Pub. No.: WO2019/045729
PCT Pub. Date: Mar. 7, 2019

(65) Prior Publication Data
US 2020/0186178 A1 Jun. 11, 2020

(51) Int. Cl.
*H04B 1/10* (2006.01)
*H03H 7/40* (2006.01)
*H04B 1/30* (2006.01)
*H04L 5/00* (2006.01)
*H04L 5/14* (2006.01)
*H04L 27/38* (2006.01)

(52) U.S. Cl.
CPC ............... *H04B 1/109* (2013.01); *H03H 7/40* (2013.01); *H04B 1/30* (2013.01); *H04L 5/0048* (2013.01); *H04L 5/143* (2013.01); *H04L 27/3863* (2013.01)

(58) Field of Classification Search
CPC combination set(s) only.
See application file for complete search history.

(56) References Cited

U.S. PATENT DOCUMENTS

| | | | |
|---|---|---|---|
| 9,712,198 B1 | 7/2017 | Zhou et al. | |
| 10,320,455 B2 * | 6/2019 | Forenza | H04B 7/0434 |
| 2003/0124999 A1 * | 7/2003 | Parssinen | H04B 1/109 |
| | | | 455/226.1 |

(Continued)

FOREIGN PATENT DOCUMENTS

KR 10-20090104116 10/2009

*Primary Examiner* — Junpeng Chen
(74) *Attorney, Agent, or Firm* — Kowert Hood Munyon Rankin and Goetzel PC

(57) ABSTRACT

Aspects include an apparatus and a method for performing Second Order Input Intercept Point (IIP2) calibration of a Digital-to-Analog (DAC) during a full-duplex mode receive operation. In some aspects, a plurality of correlation values are obtained, indicating an amount of IMD energy of an RF signal, wherein the correlation values are associated with IIP2DAC values of a DAC. In some aspects, the apparatus can calculate a mixer bias value, based on the correlation values, and adjust a bias value of a mixer according to the determined bias value. The apparatus can obtain the correlation values, calculate the bias value, and adjust the bias value of the mixer during the full-duplex mode receive operation. In some aspects, the apparatus can thus improve IIP2 of the mixer and reduce IMD energy in a receive signal, during the receive operation, without the need of standby or factory calibration.

25 Claims, 4 Drawing Sheets

(56) References Cited

U.S. PATENT DOCUMENTS

| | | | |
|---|---|---|---|
| 2008/0039045 A1* | 2/2008 | Filipovic | H04B 1/123 |
| | | | 455/295 |
| 2009/0086863 A1* | 4/2009 | Komninakis | H04B 1/10 |
| | | | 375/346 |
| 2011/0201296 A1 | 8/2011 | Kaczman et al. | |
| 2016/0285487 A1 | 9/2016 | Noest et al. | |
| 2016/0365933 A1 | 12/2016 | Jiang et al. | |

* cited by examiner

METHOD AND APPARATUS FOR IIP2 CALIBRATION

TECHNICAL FIELD

Aspects relate to receivers and methods for reducing a distortion component related to a baseband transmit signal in a baseband receive signal.

BACKGROUND

The performance of full-duplex receivers is degraded by second order inter-modulation, specifically intermodulation distortion (IMD) products generated within a mixer under the presence of a strong transmit signal. Such IMD products effect the linearity of the mixer and can limit a receiver's signal to noise ratio (SNR) and sensitivity input power levels. A Second-Order Input Intercept Point (IIP2) of a mixer is a factor indicating the linearity of the mixer. Thus, it is desirable to minimize the IMD products by increasing the IIP2 of the mixer.

DESCRIPTION OF ASPECTS

Figure 1:
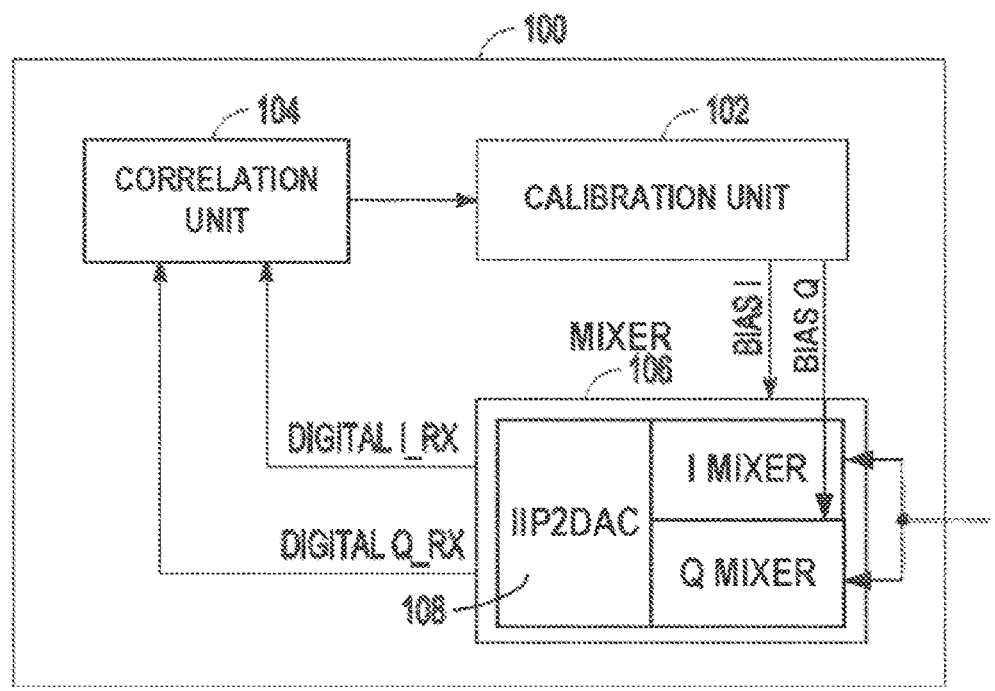
FIG. 1 illustrates a block diagram of components of a system 100 for IIP2 calibration, according to some aspects.

Known solutions for optimizing the IIP2 of a mixer for full-duplex operation, and reducing IMD products, include calibration by adjusting mixer gate bias voltages with a IIP2 Digital-to-Analog Converter (IIP2DAC) to minimize mismatch amongst transistors within the mixer. However, solutions to optimize the IIP2DAC for these purposes requires long factory calibration times, which leads to increased cost. Furthermore, prior solutions require offline or standby calibration with the use of a transmit (Tx) and receive (Rx) closed loop calibration path.

Aspects described herein address these challenges by providing an apparatus and a method of calibrating an IIP2DAC to optimize IIP2 of a mixer in a wireless communication system. Aspects do not require standby or factory calibration, rather baseband Tx data can be used during full-duplex operation to generate a digital metric of IMD power within a desired Rx signal. It is desirable to remove factory calibration and the long test times while employing a machine learning technique to quickly and accurately obtain the optimal IIP2DAC value that minimizes the IMD products and maximizes SNR.

In some aspects, a correlation unit is used to measure IMD energy and the output of the correlation unit may be utilized according to aspects described herein. In some aspects, the correlation unit can be modeled as a linear function of IDAC and QDAC. The hypothesis for the output of the correlation unit can be represented as $CORR = \theta_0 + \theta_1 DAC_I + \theta_2 DAC_Q$. In some aspects, two separate hypotheses, $CORR_I$ and $CORR_Q$, having different coefficients, are associated with CORR. Certain aspects, as described herein, determine the coefficients of these hypotheses utilizing machine learning and linear regressions. In some aspects, an optimization technique can be a standard 2D binary search technique to obtain the IIP2DAC value resulting in minimum IMD distortion. In some aspects, a standard 2D binary search technique may require 4*M computations, where M is the number of bits in the IIP2DAC. Described herein, in some aspects, are methods of determining optimal IIP2DAC values that minimize IMD distortion utilizing efficient computations and fewer measurements of IMD energy, where measurements are not dependent on the number of IIP2DAC bits. Such aspects are described in more detail below.

In a related disclosure, U.S. Patent Publication No. 2016/0285487, aspects include electronic hardware (e.g., a correlation unit) that generates the digital metric of IMD power. In some aspects, the correlation unit can be implemented, at least, by a hardware processor or digital signal processor (DSP). In some aspects, inputs to the correlation unit can include (1) a desired Rx signal that contains IMD components, and (2) a Tx signal that is used to derive a reference IMD component. A correlation can be performed between the two filtered Rx and Tx signals, over a specified measurement duration to avoid performance degradation (e.g., within a single sub-frame for LTE or a slot for WCDMA). In some aspects, at the end of the correlation period, one or more correlator lags will each generate a metric, representative of the correlation energy between the Rx data and the reference IMD component. Metrics with the most correlation energy can be represented as correlation peaks. In some aspects, the final correlation peak is normalized by the power of the correlation unit Tx input data. In some aspects, an optimization unit utilizing a firmware can utilize, from the normalized correlation peak, correlation values as inputs to a 2D binary search technique operating on IIP2DAC values associated with a mixer.

FIG. 1 illustrates a block diagram of components of a system 100 for IIP2 calibration, according to some aspects. In some aspects, the system 100 can include a transceiver, or be part of a transceiver, in a wireless communication device. In some aspects, the system 100 includes a calibration unit 102, a correlation unit 104, a mixer 106. The mixer 106, in certain aspects, includes a IIP2 Digital-to-Analog Converter (IIP2DAC) 108. In some aspects, the system 100 may include additional components not shown in FIG. 1. In some aspects, the calibration unit 102 can include e.g., firmware that is configured to perform one of the methods of IIP2 calibration, as described herein. In some aspects, the calibration unit 102 can be configured to receive one or more correlation values from a correlation unit (e.g., correlation unit 104), which may include a digital IMD meter, and wherein the correlation values can indicate an amount of intermodulation distortion (IMD) energy associated with a radio frequency (RF) signal. In some aspects, based on the correlation values, the calibration unit 102 can be configured to determine one or more optimal bias values for a mixer (e.g., mixer 106) of the wireless communication device, as described in further detail below with respect to FIG. 2.

In some aspects, the correlation unit 104 can be configured to generate correlation values utilizing the inputs of a desired Rx signal that contains IMD components and Tx signal that contains a reference IMD component. In some embodiments, the Rx and Tx signals can be complex (e.g., including both quadrature, Q, and in-phase, I, components). The correlation unit 104 can perform correlation between the two filtered Rx and Tx signals, over a duration (e.g., within a single sub-frame for LTE or a slot for WCDMA). In some aspects, at the end of the duration of a correlation period, the correlation unit 104 can generate a plurality of metrics representative of the correlation energy between the Rx data and the reference IMD component. Metrics with the most correlation energy can be represented as correlation peaks. In some aspects, a final correlation peak is normalized by the power of the correlation unit Tx input data. In some aspects, the calibration unit 102 (e.g., utilizing a firmware) can use the correlation values as inputs to calculate optimal bias values (e.g., optimal IIP2DAC values) for application to the mixer 106.

In some aspects, the IIP2DAC values for the mixer 106 can be adjusted (e.g., by the calibration unit 102) until a Correlation Quality Indicator (CQI) for both I and Q channels no longer indicates a strong correlation energy between the IMD components in the Rx signal and the reference IMD components in the Tx signal. In some aspects, the final mixer IIP2DAC values can be saved to memory (e.g., within a wireless device that includes the system 100) for a desired Rx channel to be utilized in a subsequent Rx operation. In some aspects, the mixer 106 can be configured to down mix a received radio frequency signal to a baseband receive signal. A mixer can comprise one or more transistor elements and may have a non-linear transfer function. In some aspects, a bias value (e.g., bias voltage and/or bias current) can be used to increase a linearity of the mixer. For example, through the application of a bias voltage or adjustment of a bias voltage to the mixer, IIP2 can be shifted to higher input powers, minimizing IMD products. In some aspects, the application of a bias voltage (e.g., to a gate of one or more transistor elements) increases linearity of the mixer (e.g., reduces IMD products) by minimizing an impedance mismatch, and adjusting the behavior, of the one or more transistor elements (e.g., suppressing undesired signal components of an input received RF signal in the output signal of the mixer). In some aspects, the mixer 106 can include an IIP2DAC (e.g., IIP2DAC 108), and the IIP2DAC 108 can be configured to apply one or more bias voltages and/or currents to the mixer 106 to improve the IIP2 and linearity of the mixer 106 (e.g., by adjusting an impedance match of one or more transistor elements).

Figure 2:
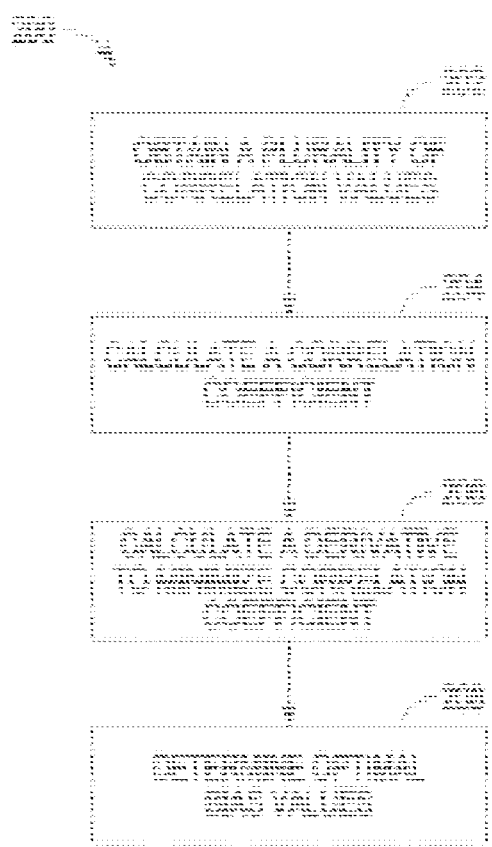
FIG. 2 illustrates a flow diagram of an exemplary method of IIP2 calibration, according to some aspects.

FIG. 2 illustrates a flow diagram of an exemplary method of IIP2 calibration. The system 100, for example, may be configured to perform IIP2 calibration as shown in FIG. 2. In 202, in some aspects, a calibration unit (e.g., calibration unit 102) can be configured to obtain a plurality of correlation values (e.g., correlation values generated by the correlation unit 104). For example, the calibration unit 102 may perform IIP2DAC measurements by selecting certain IIP2DAC values from an output of the correlation unit 104 (e.g., three measurements). In some aspects, the system 100 can perform IIP2 calibration during a period of active reception, for example, the calibration unit 102 can receive a plurality of correlation (e.g., IIP2DAC) values during reception of one or more radio frequency (RF) signals by the system 100. For example, the correlation values may indicate an amount of intermodulation distortion (IMD) energy associated with an RF signal. In some aspects, the calibration unit 102 can perform IIP2 calibration during an active receive operation resulting in degradation of performance for only a period such that IMD measurement is not disrupted (e.g., a period of less than one subframe for LTE or less than one slot for WCDMA).

In some aspects, with respect to standard LTE subframes, certain variables may change from one subframe to another. For example, Tx power and/or resource block allocation (e.g., from a Tx perspective) can change, as well as Rx signal to noise ratio (SNR) (e.g., from a correlation perspective), from one subframe to another. Accordingly, in some aspects, if the system 100 (e.g., correlation unit 104) performs correlation with such parameters changing, a correlation peak value (e.g., correlation peak values with respect to FIG. 4 may change as a function of such parameters. However, in some aspects, it is desirable to obtain IMD and/or IIP2DAC measurements with all other parameters (e.g., Tx power and resource block allocation) remaining static, such that correlation peak values are related to one another solely as a function of IIP2DAC values (e.g., from the IIP2DAC 108) changing and not as a function of any other parameters. To achieve this, in some aspects, the system 100 (e.g., correlation unit 104) may perform IMD measurements and IIP2 calibration (e.g., by the calibration unit 102) within a specified measurement duration (e.g., a single LTE subframe, WCDMA slot) such that parameters other than the IIP2DAC values remain constant. In some aspects, the system 100 can perform measurement and calibration within a single LTE subframe (e.g., prior to the occurrence of a sounding reference signal (SRS)). For example, in LTE, SRS slots may occur at 800 µs into a 1 ms subframe. In some aspects, meter hardware may require 200 µs for a valid measurement. Therefore, if three measurements are used, this can be sufficient for acquiring IIP2DAC measurements while avoiding corruption of a IIP2DAC measurement by a SRS power change (e.g., occurring at 800 µs). In some aspects, WCDMA measurements are possible given the 200 µs measuring constraint.

In some aspects, the system 100 (e.g., the calibration unit 102) can be configured to determine, based on one or more received correlation values (e.g., from the correlation unit 104), one or more optimal bias values. For example, bias values to be applied as a bias input to a IIP2DAC (e.g., IIP2DAC 108) that may change an input impedance value of IIP2DAC 108 to achieve an optimal IIP2. In some aspects, the system 100 (e.g., the calibration unit 102) may utilize a machine learning technique to determine the optimal bias values (e.g., IIP2DAC values). For example, in 204, the calibration unit 102 can be configured to calculate a correlation coefficient. In some aspects, the correlation coefficient can be based, in part, on correlation values, for example the plurality of correlation values from the output of the correlation unit 104 (e.g., three measurements). In some aspects, the calibration unit 102 may utilize a machine learning technique and the IIP2 values (e.g., obtained from the correlation unit 104) to obtain one or more optimal IIP2DAC values representative of an optimal IIP2. Such optimal IIP2DAC values may be the input bias values (e.g., bias voltages and/or bias currents) to the IIP2DAC to obtain optimal IIP2 and reduce IMD of a received signal.

In some aspects, the hypothesis with respect to one or more IIP2DAC values can be represented as follows:

$$CORR_I = \theta_0^I + \theta_1^I DAC_I + \theta_2^I DAC_Q + \theta_3^I DAC_Q DAC_I + \theta_4^I DAC_I^2 + \theta_5^I DAC_Q^2 \quad (1)$$

$$CORR_Q = \theta_0^Q + \theta_1^Q DAC_I + \theta_2^Q DAC_Q + \theta_3^Q DAC_Q DAC_I + \theta_4^Q DAC_I^2 + \theta_5^Q DAC_Q^2 \quad (2)$$

Where $\theta_0^{I,Q}$ is bias and $\theta_{1,2,3,4,5}^{I,Q}$ are coefficients for different features of equations (1) and (2), for IIP2DAC$_I$ and IIP2DAC$_Q$. In some aspects, equations (1) and (2) can be reduced (e.g., through simulation) to:

$$CORR = \theta_0 + \theta_1 DAC_I + \theta_2 DAC_Q \quad (3)$$

In some aspects, the calibration unit 102 can use linear regression to find the coefficients of equation (3). In some aspects, to solve equation (3), the calibration unit 102 may perform three measurements. In other aspects, the calibration unit 102 may perform more than three measurements, accordingly, equation (3) would include a greater number of terms and coefficients.

In some aspects, a slot time (e.g., WCDMA slot time) can be 666 μs, therefore in such aspects (e.g., so 200 μs) to run measurement, all three measurements of equation (3) may be fit within a single slot. The above equation for $DAC_I$ and $DAC_Q$ can be written in vector form as follows:

$$[CORR_I CORR_Q]_{m\times 2} = [1 DAC_I DAC_Q]_{m\times 3} * [\theta_0^I \theta_0^Q; \theta_0^I \theta_0^Q; \theta_0^I \theta_0^Q]_{3\times 2} \quad (4)$$

Or $$CORR = DAC * \theta \quad (5)$$

In some aspects, the calibration unit 102 can use the following equation in vector form in solving the linear regression to find the coefficient, θ:

$$\theta = (DAC'^* DAC)^{-1} * (DAC'^* CORR) \quad (6)$$

Where m is the number of measurements. In some aspects, involving an LTE subframe, the number of measurements may be restricted to three, which will also reduce the number of computations. Because the DAC vector is a 3×3 matrix, the calibration unit 102 may simplify the above equation as follows:

$$\theta = DAC^{-1} * CORR \quad (7)$$

Or $$\theta = \frac{1}{|DAC|} * \text{conjugate}(DAC) * CORR \quad (8)$$

Where |DAC| is the determinant of the vector DAC and conjugate (DAC) is the conjugate of vector DAC. In some aspects, because of division by a determinant, the inverse of the vector can be computationally intensive. Each division on a CPU core can take between 18-36 cycles. Therefore, in some aspects of the correlation unit 102 may calculate the minima utilizing the conjugate. In some aspects, to find minima for both $CORR_I$ and $CORR_Q$ the correlation unit 102 may utilize the following, where J(θ) is the cost function.

$$J(\theta) = CORR_I^2 + CORR_Q^2 \quad (9)$$

In 206, the correlation unit 102 may calculate a derivative value of the correlation coefficient to minimize the plurality of correlation values. For example, to find minima of the cost function (e.g., equation (9)), in some aspects, the correlation unit 102 may take the partial derivative of J(θ) for $DAC_I$ and $DAC_Q$ and solve the two equations to zero.

$$\frac{\partial J(\theta)}{\partial DAC_I} = 0 \quad (10)$$

$$\frac{\partial J(\theta)}{\partial DAC_Q} = 0 \quad (11)$$

In 208, the correlation unit 102 can be configured to find the following solutions:

$$L1 = (2,1)^2 + \theta(2,2)^2 \quad (12)$$

$$L2 = \theta(1,1)*\theta(2,1) + \theta(1,2)*\theta(2,2) \quad (13)$$

$$L3 = \theta(2,1)*\theta(3,1) + \theta(2,2)*\theta(3,2) \quad (14)$$

$$M1 = \theta(3,1)*\theta(3,1) + \theta(3,2)*\theta(3,2) \quad (15)$$

$$M2 = \theta(1,1)*\theta(3,1) + \theta(1,2)*\theta(3,2) \quad (16)$$

$$M3 = \theta(3,1)*\theta(2,1) + \theta(3,2)*\theta(2,2) \quad (17)$$

$$IDAC = (M3*L2 - L3*M2)/(L3*M1 - M3*L1) \quad (18)$$

$$QDAC = -(L1*CORR_I + L2)/L3 \quad (19)$$

In equations (18) and (19) above, IDAC and QDAC represent the optimal IIP2DAC values that may be applied as bias values to the IIP2DAC, achieving an optimal IIP2.

Figure 3:
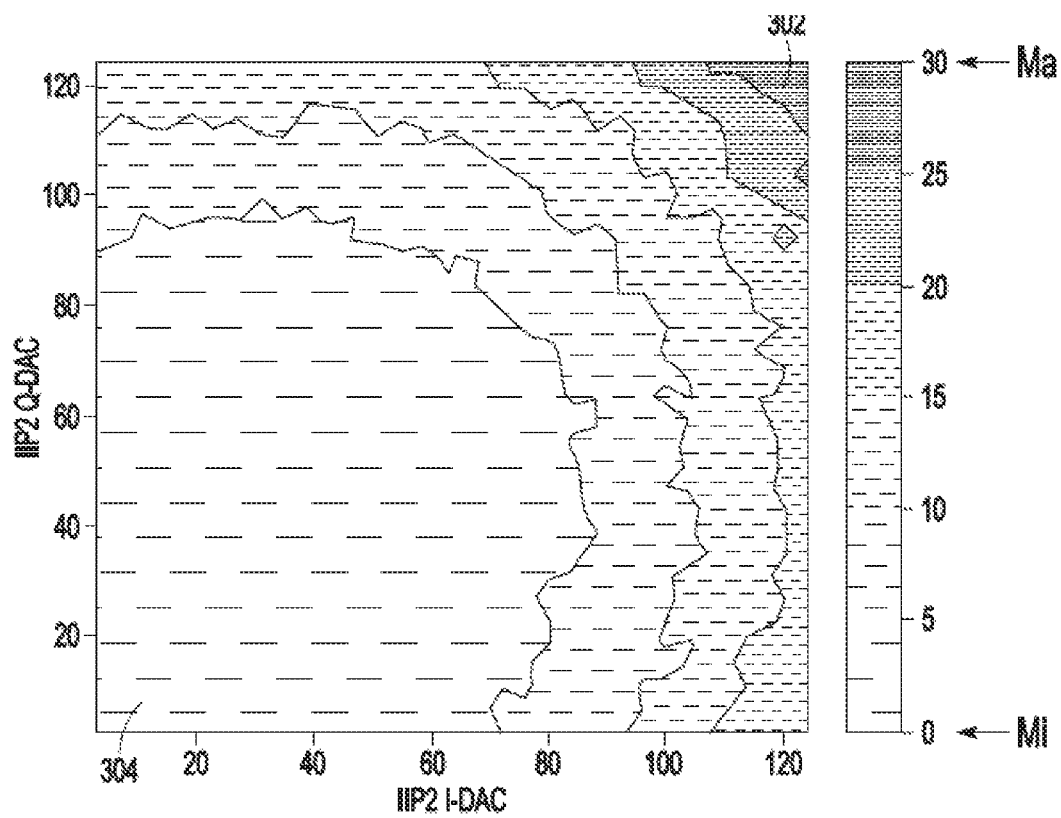
FIG. 3 illustrates a plot of correlator peak values associated with IIP2DAC values, according to some aspects.

FIG. 3 illustrates a plot of correlator peak values (e.g., amount of IMD energy) associated with IIP2DAC values (e.g., I and Q IIP2DAC values associated with the IIP2DAC 108), according to some aspects. In some aspects, with respect to FIG. 3, a small correlator peak value implies minimal IMD energy in a desired Rx signal (e.g., 304) and a high correlator peak value (e.g., 302) implies high amount of IMD energy in a desired Rx signal. The minimal values represented by FIG. 3 correlate to optimal IIP2DAC (e.g., I and Q) values to maximize IIP2. In some aspects, the data shown within FIG. 3 is obtained using, e.g., 128×128=16,384, measurements, where each IIP2DAC value is a 7-bit value. In some aspects, as described above, it is desirable for the system 100 to utilize a number of measurements that can fit within, for example, a single LTE subframe. Therefore, as opposed to utilizing the number of measurements shown in FIG. 3, the correlation unit 102 can be configured to only utilize, for example, 3 measurements of IIP2DAC values (e.g., with respect to FIG. 4).

Figure 4:
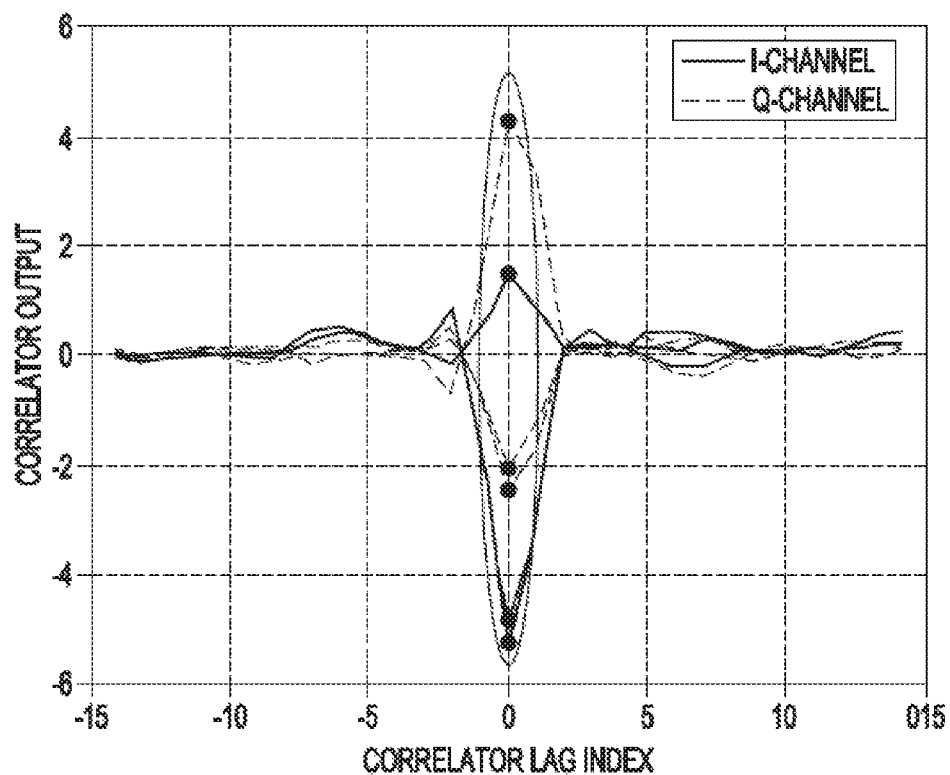
FIG. 4 illustrates a plot of correlator output values, according to some aspects.

FIG. 4 illustrates a plot of correlator output values associated with the correlation unit 104, according to some aspects. In some aspects, the correlator output is represented as an output, CORR, according to an amount of misalignment between Tx and Rx signals. In some aspects, as shown by the six points in FIG. 4 (e.g., at X=0) representing the respective I and Q correlator output values (e.g., chosen by the calibration unit 102), the calibration unit 102 is configured to choose one or more correlator output values (e.g., CORR in equations (1) through (9)) as the input values for performing IIP2DAC calibration. In some aspects, the correlator output values of FIG. 4 at the maximum and minimum points, at correlator lag index 0, may represent high amounts of IMD energy within, e.g., a Rx signal.

Figure 5:
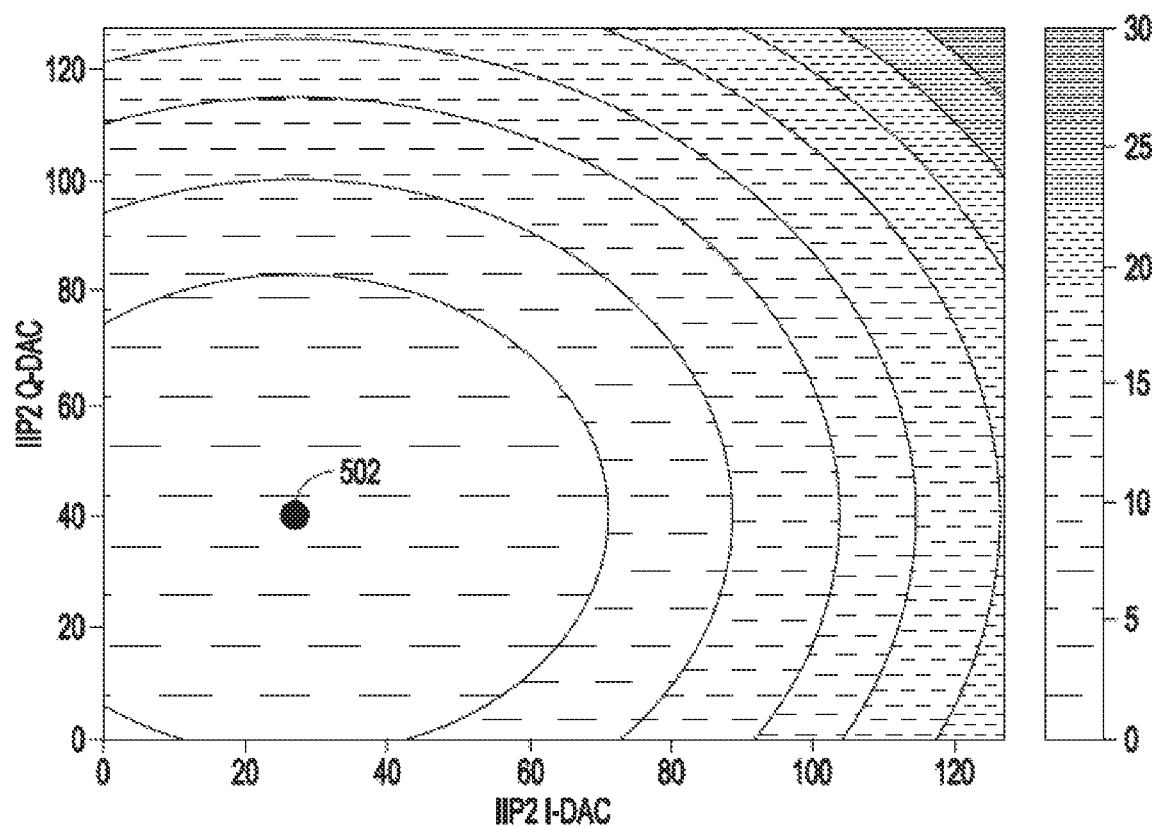
FIG. 5 illustrates a plot of correlator peak values associated with IIP2DAC values, according to some aspects.

FIG. 5 illustrates a plot of correlator peak values (e.g., amount of IMD energy) associated with IIP2DAC values (e.g., I and Q IIP2DAC values associated with the IIP2DAC 108), according to some aspects. In some aspects, the contour shown in FIG. 5 can be a representation of J(θ) with respect to, e.g., equation 9. In some aspects, similar to FIG. 3, a small correlator peak value implies minimal IMD energy in a desired Rx signal, and the minimal values represented by FIG. 3 correlate to optimal IIP2DAC (e.g., I and Q) values to maximize IIP2. In some aspects, the data shown within FIG. 5 is obtained (e.g., by the calibration unit 102) using a reduced number of IIP2DAC measurements from the correlation unit 104, for example the three measurements as shown with respect to FIG. 4. In some aspects, the IIP2DAC values are independent of the number of bits of the IIP2DAC (e.g., IIP2DAC 108). In some aspects, the search results (e.g., 402) represented by equations (18) and (19), as calculated by the calibration unit 102, represent the optimal IIP2DAC values to be utilized, for example, at the input of the IIP2DAC 108 for obtaining an optimal IIP2 and minimizing IMD energy in a Rx signal.

Figure 6:
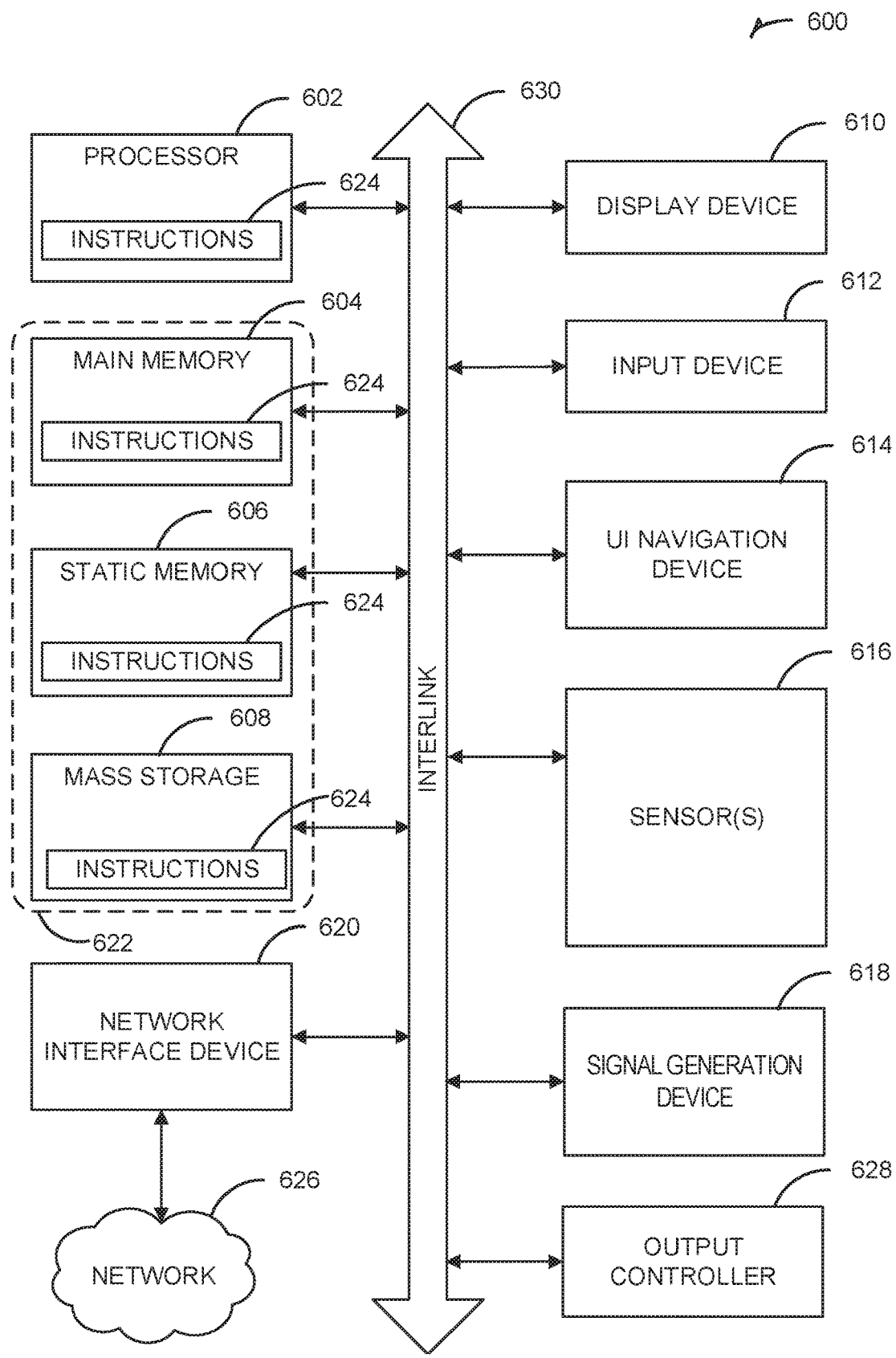
FIG. 6 illustrates block diagram of a communication device, according to some aspects.

FIG. 6 illustrates a block diagram of an example machine 600 upon which any one or more of the techniques (e.g., methodologies) discussed herein may perform. Examples, as described herein, may include, or may operate by, logic or a number of components, or mechanisms in the machine 600. Circuitry (e.g., processing circuitry) is a collection of circuits implemented in tangible entities of the machine 600 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 600 follow.

In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 600 may include a hardware processor 602 (e.g., a central processing unit (CPU), a graphics processing unit (GPU), a hardware processor core, or any combination thereof), a main memory 604, a static memory (e.g., memory or storage for firmware, microcode, a basic-input-output (BIOS), unified extensible firmware interface (UEFI), etc.) 606, and mass storage 608 (e.g., hard drive, tape drive, flash storage, or other block devices) some or all of which may communicate with each other via an interlink (e.g., bus) 630. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 608, a signal generation device 618 (e.g., a speaker), a network interface device 620, and one or more sensors 616, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 602, the main memory 604, the static memory 606, or the mass storage 608 may be, or include, a machine readable medium 622 on which is stored one or more sets of data structures or instructions 624 (e.g., software) embodying or utilized by any one or more of the techniques or functions described herein. The instructions 624 may also reside, completely or at least partially, within any of registers of the processor 602, the main memory 604, the static memory 606, or the mass storage 608 during execution thereof by the machine 600. In an example, one or any combination of the hardware processor 602, the main memory 604, the static memory 606, or the mass storage 608 may constitute the machine readable media 622. While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may be further transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®), IEEE 802.16 family of standards known as WiMax®), IEEE 802.15.4 family of standards, peer-to-peer (P2P) networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software. A transmission medium is a machine readable medium.

Examples and Additional Notes

Although an aspect has been described with reference to specific example aspects, it will be evident that various modifications and changes may be made to these aspects without departing from the broader spirit and scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

Such aspects of the inventive subject matter may be referred to herein, individually and/or collectively, by the term "aspect" merely for convenience and without intending to voluntarily limit the scope of this application to any single aspect or inventive concept if more than one is in fact disclosed. Thus, although specific aspects have been illustrated and described herein, it should be appreciated that any arrangement calculated to achieve the same purpose may be substituted for the specific aspects shown. This disclosure is intended to cover any and all adaptations or variations of various aspects. Combinations of the above aspects, and other aspects not specifically described herein, will be apparent to those of skill in the art upon reviewing the above description.

Example 1 is an apparatus of a wireless communication device, the apparatus comprising: processing circuitry and memory configured to obtain, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog (DAC); and a calibration unit configured to determine a bias value for a mixer of the wireless communication device by calculating a correlation coefficient and a derivative value of the correlation coefficient, wherein the correlation coefficient is associated with the plurality of correlation values, and wherein the processing circuitry is configured to adjust a bias of the mixer based on the determined bias value during the full-duplex mode receive operation.

In Example 2, the subject matter of Example 1 includes, wherein the memory is configured to store the correlation values, the correlation coefficient, and the correlation derivative during the full-duplex mode receive operation.

In Example 3, the subject matter of Examples 1-2 includes, wherein the calibration unit is configured to determine the bias value during full-duplex mode receive operation to reduce the amount of IMD energy in the desired Rx signal.

In Example 4, the subject matter of Examples 1-3 includes, wherein the processing circuitry is configured to modify an impedance match associated with one or more transistors of the mixer by adjusting the bias value of the mixer, according to the determined bias value, during the full-duplex mode receive operation.

In Example 5, the subject matter of Examples 1-4 includes, wherein the apparatus further comprises a Digital-to-Analog (DAC), and the DAC is configured to modify an impedance match associated with one or more transistors of the mixer by adjusting the bias value of the mixer, according to the determined bias value, during the full-duplex mode receive operation.

In Example 6, the subject matter of Examples 1-5 includes, wherein the processing circuitry is configured to obtain the plurality of correlation values from an output of a correlation unit of the wireless communication device.

In Example 7, the subject matter of Examples 1-6 includes, wherein the plurality of correlation values comprises a minimum of three correlation values.

In Example 8, the subject matter of Examples 1-7 includes, wherein the correlation values and the bias value each include an in-phase (I) and a quadrature (Q) component.

In Example 9, the subject matter of Examples 1-8 includes, wherein the apparatus is configured to obtain the plurality of correlation values, determine a bias value, and adjust the bias value of the mixer within a specified measurement duration of the full-duplex mode receive operation to avoid performance degradation.

In Example 10, the subject matter of Example 9 includes, wherein during the specified measurement duration, each correlation value is related to another correlation value as a function of one or more varying IIP2DAC values.

In Example 11, the subject matter of Examples 1-10 includes, wherein the processing circuitry is configured to adjust a bias of the mixer based on the determined bias value, during the full-duplex mode receive operation, prior to the occurrence of a sounding reference signal (SRS).

In Example 12, the subject matter of Examples 1-11 includes, wherein a number of correlation values within the plurality is independent of a number of bits of the IIP2DAC values.

Example 13 is a wireless communication device comprising: a mixer; a Digital-to-Analog (DAC) to adjust a bias of the mixer; memory; and processing circuitry configured to obtain, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog (DAC); and a calibration unit configured to determine a bias value for the mixer by calculating a correlation coefficient and a derivative value of the correlation coefficient, wherein the correlation coefficient is associated with the plurality of correlation values, and wherein the DAC is configured to adjust a bias of the mixer based on the determined bias value during the full-duplex mode receive operation.

In Example 14, the subject matter of Example 13 includes, wherein the calibration unit is configured to determine the bias value during full-duplex mode receive operation to reduce the amount of IMD energy in the desired Rx signal.

In Example 15, the subject matter of Examples 13-14 includes, wherein the DAC is configured to modify an impedance match associated with one or more transistors of the mixer by adjusting the bias value of the mixer, according to the determined bias value, during the full-duplex mode receive operation.

In Example 16, the subject matter of Examples 13-15 includes, wherein the wireless communication device is configured to obtain the plurality of correlation values, determine a bias value, and adjust the bias value of the mixer within a specified measurement duration of the full-duplex mode receive operation to avoid performance degradation.

In Example 17, the subject matter of Example 16 includes, wherein during the specified measurement duration, each correlation value is related to another correlation value as a function of one or more varying IIP2DAC values.

Example 18 is a method of Second Order Input Intercept Point (IIP2) calibration of a Digital-to-Analog (DAC), the method comprising: obtaining, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog (DAC); and determining a bias value, including: calculating a correlation coefficient and a derivative value of the correlation coefficient, wherein the correlation coefficient is associated with the plurality of correlation values, and adjusting a bias of a mixer based on the determined bias value during the full-duplex mode receive operation.

In Example 19, the subject matter of Example 18 includes, determining the bias value during full-duplex mode receive operation to reduce the amount of IMD energy in the desired Rx signal.

In Example 20, the subject matter of Examples 18-19 includes, modifying an impedance match associated with one or more transistors of the mixer by adjusting the bias value of the mixer, according to the determined bias value, during the full-duplex mode receive operation.

In Example 21, the subject matter of Examples 18-20 includes, obtaining the plurality of correlation values, determining a bias value, and adjusting the bias value of the mixer within a specified measurement duration of the full-duplex mode receive operation to avoid performance degradation, wherein during the specified measurement duration, each correlation value is related to another correlation value as a function of one or more varying IIP2DAC values.

Example 22 is a computer-readable hardware storage device that stores instructions for execution by one or more processors, the instructions to configure the one or more processors to: obtain, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog (DAC); and determine a bias value, including: calculate a correlation coefficient and a derivative value of the correlation coefficient, wherein the correlation coefficient is associated with the plurality of correlation values, and adjust a bias of a mixer based on the determined bias value during the full-duplex mode receive operation.

In Example 23, the subject matter of Example 22 includes, wherein the one or more processors are further configured to determine the bias value during full-duplex mode receive operation to reduce the amount of IMD energy in the desired Rx signal.

In Example 24, the subject matter of Examples 22-23 includes, wherein the one or more processors are further configured to modify an impedance match associated with one or more transistors of the mixer by adjusting the bias value of the mixer, according to the determined bias value, during the full-duplex mode receive operation.

In Example 25, the subject matter of Examples 22-24 includes, wherein the one or more processors are further configured to obtain the plurality of correlation values, determining a bias value, and adjusting the bias value of the mixer within a specified measurement duration of the full-duplex mode receive operation to avoid performance degradation, wherein during the specified measurement duration, each correlation value is related to another correlation value as a function of one or more varying IIP2DAC values.

Example 26 is at least one machine-readable medium including instructions that, when executed by processing circuitry, cause the processing circuitry to perform operations to implement of any of Examples 1-25.

Example 27 is an apparatus comprising means to implement of any of Examples 1-25.

Example 28 is a system to implement of any of Examples 1-25.

Example 29 is a method to implement of any of Examples 1-25.

The above detailed description includes references to the accompanying drawings, which form a part of the detailed description. The drawings show, by way of illustration, specific aspects which can be practiced. These aspects are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope should be determined with reference to the appended claims, along with the full scope of equivalents to which such claims are entitled.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus, comprising:
   a memory comprising program instructions; and
   a processor configured to execute the program instructions and cause a wireless communication device to:
      obtain, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog Converter (DAC); and
   determine a bias value for a mixer of the wireless communication device by calculating a correlation coefficient and a derivative value of the correlation coefficient, wherein the correlation coefficient is associated with the plurality of correlation values, and wherein the processor is configured to adjust a bias of the mixer based on the determined bias value during the full-duplex mode receive operation.

2. The apparatus of claim 1, wherein the processor is further configured to cause the wireless communication device to store the correlation values, the correlation coefficient, and the derivative value of the correlation coefficient during the full-duplex mode receive operation.

3. The apparatus of claim 1, wherein the processor is further configured to cause the wireless communication device to determine the bias value during full-duplex mode receive operation to reduce the amount of IMD energy in the desired Rx signal.

4. The apparatus of claim 1, wherein the processor is further configured to cause the wireless communication device to modify an impedance match associated with one or more transistors of the mixer by adjusting the bias value of the mixer, according to the determined bias value, during the full-duplex mode receive operation.

5. The apparatus of claim 1, wherein the processor is further configured to cause the wireless communication device to modify an impedance match associated with one or more transistors of the mixer by adjusting the bias value of the mixer, according to the determined bias value, during the full-duplex mode receive operation.

6. The apparatus of claim 1, wherein the processor is further configured to obtain the plurality of correlation values from an output of a correlation unit of the wireless communication device.

7. The apparatus of claim 1, wherein the plurality of correlation values comprises a minimum of three correlation values.

8. The apparatus of claim 1, wherein the correlation values and the bias value each include an in-phase (I) and a quadrature (Q) component.

9. The apparatus of claim 1, wherein the processor is further configured to cause the wireless communication device to obtain the plurality of correlation values, determine a bias value, and adjust the bias value of the mixer within a specified measurement duration of the full-duplex mode receive operation to avoid performance degradation.

10. The apparatus of claim 9, wherein during the specified measurement duration, each correlation value is related to another correlation value as a function of one or more varying IIP2DAC values.

11. The apparatus of claim 1, wherein the processor is further configured to cause the wireless communication device to adjust a bias of the mixer based on the determined bias value, during the full-duplex mode receive operation, prior to an occurrence of a sounding reference signal (SRS).

12. The apparatus of claim 1, wherein a number of correlation values within the plurality of correlation values is independent of a number of bits of the IIP2DAC values.

13. A wireless communication device, comprising:
   a mixer;
   a Digital-to-Analog Converter (DAC) to adjust a bias of the mixer;
   memory; and
   a processor configured to:
      obtain, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of the DAC; and
   determine a bias value for the mixer by calculating a correlation coefficient and a derivative value of the correlation coefficient, wherein the correlation coefficient is associated with the plurality of correlation values, and wherein the DAC is configured to adjust a bias of the mixer based on the determined bias value during the full-duplex mode receive operation.

14. The wireless communication device of claim 13, wherein the processor is further configured to determine the bias value during full-duplex mode receive operation to reduce the amount of IMD energy in the desired Rx signal.

15. The wireless communication device of claim 13, wherein the processor is configured to modify an impedance match associated with one or more transistors of the mixer by adjusting the bias value of the mixer, according to the determined bias value, during the full-duplex mode receive operation.

16. The wireless communication device of claim 13, wherein the processor is configured to obtain the plurality of correlation values, determine a bias value, and adjust the bias value of the mixer within a specified measurement duration of the full-duplex mode receive operation to avoid performance degradation.

17. The wireless communication device of claim 16, wherein during the specified measurement duration, each correlation value is related to another correlation value as a function of one or more varying IIP2DAC values.

18. A method of Second Order Input Intercept Point (IIP2) calibration of a Digital-to-Analog Converter (DAC), the method comprising:
  obtaining, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog (DAC); and
  determining a bias value, including:
    calculating a correlation coefficient and a derivative value of the correlation coefficient, wherein the correlation coefficient is associated with the plurality of correlation values; and
    adjusting a bias of a mixer based on the bias value during the full-duplex mode receive operation.

19. The method of claim 18, further comprising determining the bias value during full-duplex mode receive operation to reduce the amount of IMD energy in the desired Rx signal.

20. The method of claim 18, further comprising modifying an impedance match associated with one or more transistors of the mixer by adjusting the bias value of the mixer, according to the determined bias value, during the full-duplex mode receive operation.

21. The method of claim 18, further comprising:
  obtaining the plurality of correlation values;
  determining a bias value; and
  adjusting the bias value of the mixer within a specified measurement duration of the full-duplex mode receive operation to avoid performance degradation, wherein during the specified measurement duration, each correlation value is related to another correlation value as a function of one or more varying IIP2DAC values.

22. A computer-readable hardware storage device that stores instructions for execution by one or more processors, the instructions to configure the one or more processors to:
  obtain, during a full-duplex mode receive (Rx) operation, a plurality of correlation values from one or more radio frequency (RF) signals, the correlation values indicating an amount of intermodulation distortion (IMD) energy in a desired receive (Rx) signal of the one or more RF signals, wherein the correlation values are associated with Second Order Input Intercept Point Digital-to-Analog Converter (IIP2DAC) values of a Digital-to-Analog Converter (DAC); and
  determine a bias value, including:
    calculate a correlation coefficient and a derivative value of the correlation coefficient, wherein the correlation coefficient is associated with the plurality of correlation values; and
    adjust a bias of a mixer based on the determined bias value during the full-duplex mode receive operation.

23. The computer-readable hardware storage device of claim 22, wherein the one or more processors are further configured to determine the bias value during full-duplex mode receive operation to reduce the amount of IMD energy in the desired Rx signal.

24. The computer-readable hardware storage device of claim 22, wherein the one or more processors are further configured to modify an impedance match associated with one or more transistors of the mixer by adjusting the bias value of the mixer, according to the determined bias value, during the full-duplex mode receive operation.

25. The computer-readable hardware storage device of claim 22, wherein the one or more processors are further configured to:
  obtain the plurality of correlation values;
  determine a bias value; and
  adjust the bias value of the mixer within a specified measurement duration of the full-duplex mode receive operation to avoid performance degradation, wherein during the specified measurement duration, each correlation value is related to another correlation value as a function of one or more varying IIP2DAC values.

* * * * *